MULTI-BAND OSCILLATION GENERATOR
Filed Sept. 6, 1961
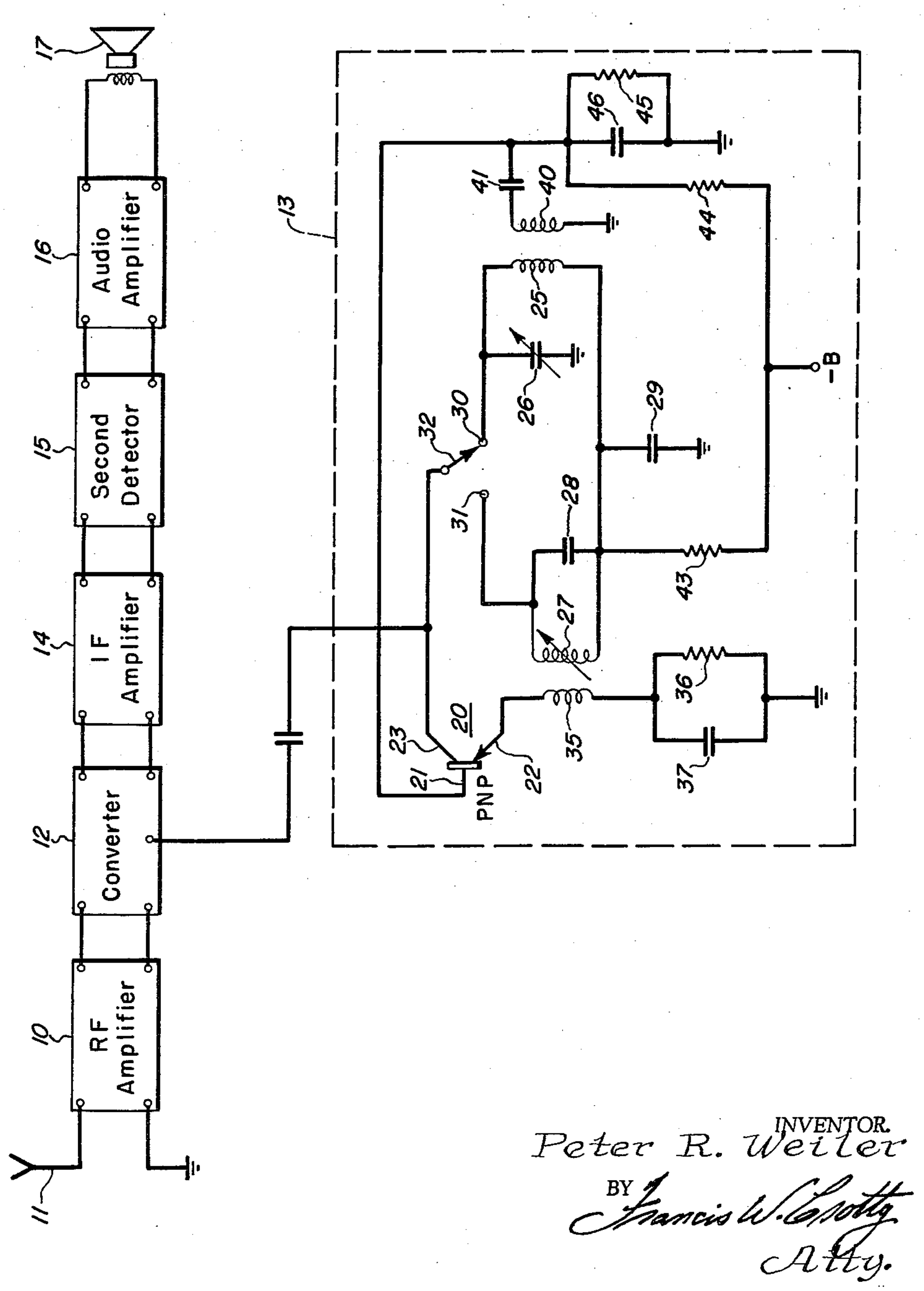
INVENTOR.
Peter R. Weiler
BY Francis W. Crotty
Atty.

United States Patent Office 3,105,204

Patented Sept. 24, 1963

3,105,204

MULTI-BAND OSCILLATION GENERATOR

Peter R. Weiler, Mount Prospect, Ill., assignor to Zenith Radio Corporation, a corporation of Delaware Filed Sept. 6, 1961, Ser. No. 136,230
6 Claims. (Cl. 331—117)

The present invention concerns an oscillation generator that is tunable over a pair of frequency bands and, while being of general application, is particularly suited for application in a radio receiver for accepting amplitude modulation as well as frequency modulation broadcasts. For convenience, it will be described in that connection.

An AM/FM broadcast receiver is, of course, well known and is usually constructed to avoid unnecessary duplication of stages while still accommodating both the AM and FM type of broadcast signals. The arrangement to be described herein as a further development leading to the simplification of such a receiver and takes advantage of the flexibility of transistor or semiconductor devices.

Accordingly, it is an object of the invention to provide a novel oscillation generator that is tunable over a pair of frequency bands.

It is a particular object of the invention to provide an improved oscillation generator for an AM/FM radio broadcast receiver.

An oscillation generator tunable over a pair of frequency bands and embodying the subject invention comprises an amplifying device having a pair of input electrodes and an output electrode. There are a pair of resonant circuits respectively tunable over each of the desired frequency bands, having low-potential terminals connected to a plane of reference potential such as ground and also having high-potential terminals. A two-position switch connects to the output electrode of the device and is arranged for selective connection to the high-potential terminals of the tunable resonant circuits. Circuit means connect one of the input electrodes to ground and this circuit means presents an inconsequential impedance at the operating frequency determined by one of the resonant circuits. The means in question in addition is coupled to the other of the resonant circuits to provide regenerative feedback to sustain oscillations at frequencies determined by the aforesaid other circuit. In similar fashion, circuit means connect the other one of the input electrodes to ground and present an inconsequential impedance at the operating frequency determined by the aforesaid other resonant circuit. This last-mentioned circuit means is coupled to the aforesaid one resonant circuit to provide regenerative feedback in order to sustain oscillations at frequencies determined by said one resonant circuit.

In a particular configuration of the circuit, a pair of tunable tank circuits may be selectively connected to the collector electrode of a transistor. The emitter circuit has a coil which provides feedback for operation in one frequency band but yet presents a low-impedance so that the oscillator functions with an essentially grounded emitter in the other band. The base circuit is of similar structure, including a feedback winding which is effective in the second band but presenting, by virtue of distributive capacitance or otherwise, such a low impedance that the base is effectively grounded during operation in the first band.

The features of the present invention which are believed to be novel are set forth with particularity in the appended claims. The organization and manner of operation of the invention, together with further objects and advantages thereof, may best be understood by reference to the following description taken in connection with the accompanying drawing, the single FIGURE which is a schematic representation of a two-band receiver employing the present invention.

Referring now more particularly to the drawing, the arrangement there represented is a receiver for selectively receiving and utilizing amplitude modulation and frequency modulation broadcast signals. It comprises a radio-frequency amplifier 10 of any desired number of stages having an input connected to an antenna system 11. The output circuit of amplifier 10 is connected to a converter or first detector 12 which is also coupled to a heterodyne oscillator enclosed within broken-line rectangle 13. Connected in cascade to the output circuit of converter 12 are an intermediate-frequency amplifier 14 of any desired number of stages, a second detector 15 and a sound system consisting of an audio-frequency amplifier 16 connected to and driving a sound reproducer or loud speaker 17. Aside from the specific circuitry of heterodyne oscillator 13, this receiver is of entirely conventional construction and therefore its major components have been represented by block diagrams. It will be understood, for example, that amplifier 10 will be provided with two sets of RF selectors, one which is tunable over the AM band and another tunable over the FM band. Converter 12 may likewise be provided with sets of tuned input selectors efficiently to utilize signals delivered from amplifier 10 and heterodyne oscillator 13 in accordance with the band in which reception is intended to take place.

It is customary that the intermediate frequency of an amplitude modulation receiver be specifically different from that of a frequency modulation receiver. For this reason, an AM/FM receiver oftentimes employs in the intermediate-frequency amplifier one set of selectors tuned to the IF established during AM reception and another set tuned to the IF developed during FM reception. A switch selectively connects these frequency selective networks to common amplifier tubes.

It is of course understood that the second or signal detector 15 for amplitude modulation usually is distinctly different in structure from that utilized for FM reception. It is convenient to provide separate signal detectors that may likewise be switched and rendered selectively active depending upon the type reception desired. The audio information available at the output of the second detector, however, is the same irrespective of the type broadcast that has been received and for that reason the audio system 16, 17 is utilized for both AM and FM reception.

As will be described more clearly hereinafter, heterodyne oscillator 13 produces a heterodyning signal of appropriate value for signal reception in either the AM or FM frequency bands, the choice of band being made by a switch.

In the use of the AM/FM receiver a band selector switch (not shown) is adjusted for amplitude modulation or frequency modulation reception. It occasions the selective connections to all of the stages of the receiver which have dual characteristics so that each is properly conditioned for the type reception that is desired. Since the structure of this band switching is exceedingly well known in the art, it has not been illustrated in the drawing. In the operation of the receiver, after the band switch has been set to condition the receiver for reception of an AM or FM signal, the usual station selector is adjusted to tune the tunable stages of the receiver as required to make the selection of the desired signal within its particular frequency band. Having thus tuned the receiver, the desired signal is selected by amplifier 10 and delivered to converter 12 where it is mixed or heterodyned with a signal concurrently supplied from heterodyne oscillator 13 to the converter. The resulting intermediate-frequency signal after amplification in amplifier 14 is finally detected in detector 15. The detected signal is further amplified in audio amplifier 16 and utilized to drive loud speaker 17. More particular consideration will now be given to the structure of the heterodyning oscillator.

It is tunable over a pair of frequency bands. Each band is related, frequency-wise, to the AM and FM bands as required to develop an intermediate frequency signal of appropriate value in converter 12. Structurally, the generator comprises a semiconductor device 20 shown as a PNP junction transistor having a base electrode 21, an emitter electrode 22 and a collector electrode 23. The gender of the transistor is of no consequence; an NPN type of device is equally suitable.

There are a pair of resonant circuits respectively tunable over the two operating bands of the generator. One such resonant circuit comprises an inductor 25 and an adjustable tuning capacitor 26, this circuit being tunable to effect reception of signals in the amplitude modulation band extending from 540 to 1600 kilocycles. The other resonant circuit comprises an adjustable inductor 27 and a capacitor 28 which is tunable to effect reception of signals in the FM band which extends from 88 to 108 megacycles. The low-potential terminal of each resonant circuit is connected to a plane of reference potential or ground through an RF bypass capacitor 29. The high-potential terminals of these resonant or tank circuits are shown connected with stationary contacts 30 and 31 of a two-position switch having a movable blade 32 through which the high-potential terminals of the tank circuits may be selectively connected to one of the electrodes of transistor 20, as shown, the common switch terminal connects with collector electrode 23.

There are circuit means for connecting another of the electrodes of the transistor to ground. In the case of emitter 22, this circuit means includes a winding or coil 35 inductively coupled to resonant circuit 27, 28 to provide regenerative feedback in order to sustain oscillations at frequencies determined by that resonant circuit. The emitter circuit further includes a self-biasing resistor 36 bypassed by a capacitor 37 conjointly returning the low-potential terminal of winding 35 to ground. At the operating frequency of the oscillator during reception of amplitude modulated signals, the inductive impedance of coil 35 is inconsequential and for such operation the emitter is essentially at RF ground.

There is a generally similar circuit means for connecting the remaining one of the electrodes, specifically base electrode 21, to ground. It comprises a winding 40 which is inductively coupled to inductor 25 as required to provide sufficient regenerative feedback to sustain oscillations at operating frequencies of the heterodyne oscillator dur- the reception of amplitude modulated signals. One terminal of coil 40 is grounded and the other is coupled through a capacitor 41 to base electrode 21.

The usual operating bias supply includes a negative potential source designated B which may be a battery. A network extends from this source through a resistor 43 and through the instantaneously active one of resonant circuits 25, 26 and 27, 28 to the collector electrode to establish the usual reverse bias thereat. A voltage dividing network of resistors 44 and 45 develops an operating bias for the base electrode which is coupled to the junction of resistors 44 and 45. Resistor 45 is bypassed for radio frequencies by a capacitor 46. During operating intervals in which the receiver is to utilize a frequency modulation broadcast, base electrode 21 is established at essentially RF ground through the conjoint effect of the distributed capacitance of coil 40 and capacitance 46.

In operation, band selector switch 32 of heterodyne oscillator 13 may be positioned to engage contact 31 concurrently with adjustment of the bandpass selector switch of the receiver. When placed in contact with the terminal 30, as illustrated, resonant circuit 25, 26 is effective, emitter 22 is established essentially at RF ground and feedback coil 40 establishes the necessary regenerative feedback. The oscillator is now conditioned to supply a signal for converting program signals in the AM band to the AM intermediate frequency of the receiver. The specific operating frequency of the receiver is controlled by adjustment of tuning capacitor 26. Conversely, with switch blade 32 in engagement with contact 31, resonant circuit 27, 28 is operatively connected in the oscillating circuit. The base now operates at essentially RF ground and the feedback is between collector and emitter through the coupling of coils 27 and 35. The signal developed by oscillator 13 is now appropriate to convert a program signal to the FM intermediate frequency of the receiver. The specific operating frequency of the oscillator is determined by adjustment of its variable inductor 27.

One embodiment of the invention, constructed and found to operate satisfactorily, employs the following circuit constants which are given purely by way of illustration and not limitation.

| | |
|---|---|
| Resistor 36 | 560 ohms. |
| Resistor 43 | 220 ohms. |
| Resistor 44 | 27,000 ohms. |
| Resistor 45 | 5,600 ohms. |
| Capacitor 26 | 6–140 micromicrofarads variable. |
| Capacitor 28 | 20 micromicrofarads. |
| Capacitors 29, 37, 41 | .05 microfarad. |
| Capacitor 46 | .01 microfarad. |
| Coils 25, 27 | Resonant with 26, 28. |
| Coils 35, 40 | Closed coupled to 27, 25. |
| Transistor 20 | Type 2N384. |
| Battery voltage | —12 volts. |
| Tuning range for AM | 540 kc.–1600 kc. |
| Tuning range for FM | 88 mc.–108 mc. |

It has been convenient to describe the invention in the environment of an AM/FM receiver to which it has obvious application. However, a generator constructed in the manner of oscillator 13 is useful in any multi-band receiver.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. An oscillation generator tunable over a pair of frequency bands comprising: an amplifying device having a pair of input electrodes and an output electrode; a pair of resonant circuits respectively tunable over said frequency bands, having low-potential terminals connected to a plane of reference potential and having high-potential terminals; a two position switch connected to said output electrode for selective connection to the high-potential terminals of said resonant circuits; circuit means for connecting one of said input electrodes to said plane of reference potential, presenting an inconsequential impedance at operating frequencies determined by one of said resonant circuits and coupled to the other of said resonant circuits to provide regenerative feedback to sustain oscillations at frequencies determined by said other resonant circuit; and circuit means for connecting the other of said input electrodes to said plane of reference potential, presenting an inconsequential impedance at operating frequencies determined by said other resonant circuit and coupled to said one resonant circuit to provide regenerative feedback to sustain oscillations at frequencies determined by said one resonant circuit.

2. An oscillation generator tunable over a pair of frequency bands comprising: a semiconductor device having base, emitter and collector electrodes; a pair of resonant circuits respectively tunable over said frequency bands, having low-potential terminals connected to a plane of reference potential having high-potential terminals; a two-position switch connected to one of said electrodes for selective connection to the high-potential terminals of said resonant circuits; circuit means for connecting another of said electrodes to said plane of reference potential, presenting an inconsequential impedance at operating frequencies determined by one of said resonant circuits and coupled to the other of said resonant circuits to provide regenerative feedback to sustain oscillations at frequencies determined by said other resonant circuit; and circuit means for connecting the remaining one of said electrodes to said plane of reference potential, presenting an inconsequential impedance at operating frequencies determined by said other resonant circuit and coupled to said one resonant circuit to provide regenerative feedback to sustain oscillations at frequencies determined by said one resonant circuit.

3. An oscillation generator tunable over a pair of frequency bands comprising: a semiconductor device having base, emitter and collector electrodes; a pair of resonant circuits respectively tunable over said frequency bands, having low-potential terminals connected to a plane of reference potential and having high-potential terminals; a two-position switch connected to one of said electrodes for selective connection to the high-potential terminals of said resonant circuits; circuit means for connecting another of said electrodes to said plane of reference potential, presenting an inconsequential impedance at operating frequencies determined by one of said resonant circuits and including a winding inductively coupled to the other of said resonant circuits to provide regenerative feedback to sustain oscillations at frequencies determined by said other resonant circuit; and circuit means for connecting the remaining one of said electrodes to said plane of reference potential, presenting an inconsequential impedance at operating frequencies determined by said other resonant circuit and including a winding inductively coupled to said one resonant circuit to provide regenerative feedback to sustain oscillations at frequencies determined by said one resonant circuit.

4. An oscillation generator tunable over a pair of frequency bands comprising: a semiconductor device having base, emitter and collector electrodes; a pair of resonant circuits respectively tunable over said frequency bands, having low-potential terminals connected to a plane of reference potential and having high-potential terminals; a two-position switch connected to said collector electrode for selective connection to the high-potential terminals of said resonant circuits; circuit means for connecting said emitter electrode to said plane of reference potential, presenting an inconsequential impedance at operating frequencies determined by one of said resonant circuits and including a winding inductively coupled to the other of said resonant circuits to provide regenerative feedback to sustain oscillations at frequencies determined by said other resonant circuit; and circuit means for connecting said base electrode to said plane of reference potential, presenting an inconsequential impedance at operating frequencies determined by said other resonant circuit and including a winding inductively coupled to said one resonant circuit to provide regenerative feedback to sustain oscillations at frequencies determined by said one resonant circuit.

5. An oscillation generator tunable over a pair of frequency bands comprising: a semiconductor device having base, emitter and collector electrodes; a pair of resonant circuits respectively tunable over said frequency bands, having low-potential terminals connected to a plane of reference potential and having high-potential terminals; a two-position switch connected to said collector electrode for selective connection to the high-potential terminals of said resonant circuits; circuit means for connecting said emitter electrode to said plane of reference potential, presenting an inconsequential impedance at operating frequencies determined by one of said resonant circuits and including a self-bias network as well as a winding inductively coupled to the other of said resonant circuits to provide regenerative feedback to sustain oscillations at frequencies determined by said other resonant circuit; circuit means for connecting said base electrode to said plane of reference potential, presenting an inconsequential impedance at operating frequencies determined by said other resonant circuit and including a winding inductively coupled to said one resonant circuit to provide regenerative feedback to sustain oscillations at frequencies determined by said one resonant circuit; and means, including said resonant circuits, for applying an operating bias to said collector electrode.

6. A heterodyne oscillation generator for a wave-signal receiver tunable over the amplitude-modulation and the frequency-modulation broadcast bands comprising: a semiconductor device having base, emitter and collector electrodes; a resonant circuit tunable over a band having a predetermined frequency spacing from the amplitude-modulation broadcast band and a resonant circuit tunable over another band having a predetermined frequency spacing from the frequency-modulation broadcast band, both of said resonant circuits having low-potential terminals connected to a plane of reference potential and having high-potential terminals; a two-position switch connected to one of said electrodes for selective connection to the high-potential terminals of said resonant circuits; circuit means for connecting another of said electrodes to said plane of reference potential, presenting an inconsequential impedance at operating frequencies determined by one of said resonant circuits and including a winding inductively coupled to the other of said resonant circuits to provide regenerative feedback to sustain oscillations at frequencies determined by said other resonant circuit; and circuit means for connecting the remaining one of said electrodes to said plane of reference potential, presenting an inconsequential impedance at operating frequencies determined by said other resonant circuit and including a winding inductively coupled to said one resonant circuit to provide regenerative feedback to sustain oscillations at frequencies determined by said one resonant circuit.

No references cited.